United States Patent [19]

Johnson et al.

[11] Patent Number: 4,948,707

[45] Date of Patent: Aug. 14, 1990

[54] CONDITIONING A NON-CONDUCTIVE SUBSTRATE FOR SUBSEQUENT SELECTIVE DEPOSITION OF A METAL THEREON

[75] Inventors: Robert W. Johnson, Endicott; William H. Lawrence, Greene; Gary K. Lemon; Roy H. Magnuson, both of Endicott; Voya R. Markovich, Endwell; Ralph E. Parsons, Endicott; Carlos J. Sambucetti, Croton-On-Hudson, all of N.Y.

[73] Assignee: International Business Machines Corporation, Armonk, N.Y.

[21] Appl. No.: 156,519

[22] Filed: Feb. 16, 1988

[51] Int. Cl.$^5$ .............................................. G03C 5/00
[52] U.S. Cl. ...................................... 430/11; 430/15; 430/327; 430/330; 427/96; 427/98; 427/304; 427/305; 427/306; 427/307
[58] Field of Search ............... 430/311, 313, 315, 319, 430/330, 324, 328, 394, 327, 210, 221, 280; 427/96, 98, 304, 305, 306, 385.5, 404, 501, 307, 322

[56] References Cited

U.S. PATENT DOCUMENTS

| | | | |
|---|---|---|---|
| 3,506,482 | 4/1970 | Hirohata et al. | 117/212 |
| 3,982,045 | 9/1976 | Kukanskis | 427/98 |
| 4,169,732 | 10/1979 | Shipley | 96/35.1 |
| 4,209,331 | 6/1980 | Kukanskis et al. | 427/305 |
| 4,233,344 | 11/1980 | Brasch | 427/304 |
| 4,237,216 | 12/1980 | Skarvinko | 430/280 |
| 4,259,435 | 3/1981 | Broer et al. | 430/313 |
| 4,302,530 | 11/1981 | Zemel | 430/311 |
| 4,309,462 | 1/1982 | Dillard et al. | 427/306 |
| 4,325,990 | 4/1982 | Ferrier | 427/305 |
| 4,448,804 | 5/1984 | Amelio et al. | 427/98 |
| 4,526,810 | 7/1985 | Nesbitt | 427/98 |
| 4,640,718 | 2/1987 | Alnot | 427/304 |
| 4,701,351 | 11/1987 | Jackson | 427/98 |
| 4,735,820 | 4/1988 | Agustine et al. | 427/98 |
| 4,748,104 | 5/1988 | Ferrier et al. | 430/315 |
| 4,782,007 | 11/1988 | Ferrier | 430/313 |

OTHER PUBLICATIONS

European Search Report No. 89101763.4.
Cohen, et al., "Sensitization With Palladium-Tin Colloids, I: Role of Rinse and Accelerator Steps", Plating and Surface Finishing, pp. 52-55.
Rantell, et al., "Mechanism of Activation of Polymer Surfaces by Mixed Stannous Chloride/Palladium Chloride Catalysts", Transactions of the Institute of Metal Finishing, vol. 51, Conference 1973, Part 2, pp. 62-68.

*Primary Examiner*—Ellis P. Robinson
*Assistant Examiner*—Donald J. Loney
*Attorney, Agent, or Firm*—Pollock, Vande Sande & Priddy

[57] ABSTRACT

A non-conductive substrate is conditioned for subsequent selective deposition of a metal thereon by providing at least one of the major surfaces of the substrate in roughened form, contacting that surface(s) with a palladium/tin catalyst, activating the catalyst by employing an alkali hydroxide solution, laminating a photosensitive composition to the major surface(s), and exposing the photosensitive composition to actinic light in a predetermined pattern and then developing to provide the predetermined pattern.

20 Claims, No Drawings

CONDITIONING A NON-CONDUCTIVE SUBSTRATE FOR SUBSEQUENT SELECTIVE DEPOSITION OF A METAL THEREON

DESCRIPTION

1. Technical Field

The present invention is concerned with conditioning a non-conductive substrate and is especially concerned with treating a non-conductive substrate to prepare such for the subsequent selective deposition thereon of a metal from an electroless plating bath. The method of the present invention finds special applicability in the manufacture of printed circuit cards and printed circuit boards.

2. Background Art

In the manufacture of printed circuit cards and boards a non-conductive material is employed as the substrate. A conductive circuit pattern is provided on one or both of the major surfaces of the substrate.

A conductive pattern can be formed on the surface(s) of the substrate using a variety of known techniques. These known techniques include the subtractive technique whereby a layer of conductive metal such as copper is etched to form the desired circuit pattern, the EDB (electroless direct bond) technique whereby a conductive metal such as copper is plated from an electroless plating bath directly onto the surface of the substrate in the desired pattern, and the peel-apart technique where the desired circuit pattern is plated up from a thin layer of what is referred to as a "peel-apart metal" such as peel-apart copper.

In any of these techniques connections between layers are made by means of plated through-holes. In plating such holes the metal, such as copper, must be plated directly onto the non-conductive substrate (on the walls of the holes). Furthermore, if one uses the EDB technique, one must plate directly on the surface of the substrate.

In view of the nature of the substrate being nonconductive, in order to plate on the substrate, the substrate must be seeded or catalyzed prior to deposition of metal thereon.

Among the more widely employed procedures for catalyzing a substrate is the use of a stannous chloride sensitizing solution and a palladium chloride activator to form a layer of metallic palladium particles. One such method for catalyzing a dielectric substrate is exemplified in U.S. Pat. No. 3,011,920 to Shipley which includes sensitizing a substrate by first treating it with a solution of a colloidal metal, accelerating the treatment with a selective solvent to remove protective colloids from the sensitized non-conductive substrate, and then electrolessly depositing a metal coating on the sensitized substrate; for example, with copper from a solution of a copper salt and a reducing agent.

As the demands over the years for more complex circuitry and for finer lines have increased, continuing efforts have been made in the refinement of the seeding or catalyzing procedure. For instance, suggestions have been made to employ a permanent resist material over the catalyst in a predetermined pattern in order to mask out or define the non-circuit areas of the substrate, followed by electrolessly plating on those areas not masked out by the permanent resist material. However, such procedures have not been entirely satisfactory in view of the presence of the catalyzing material beneath the resist layer that tends to cause current leakage between circuit lines in close proximity to each other. This problem is especially pronounced in high density packaging circuits, for instance, where circuit lines are only about 2 to about 3 mils apart. An example of a suggestion of a process employing a permanent resist mask can be found in U.S. Pat. No. 3,982,045 to Kukanskis.

SUMMARY OF INVENTION

The process of the present invention is concerned with conditioning a non-conductive substrate for the subsequent selective deposition thereon of a metal from an electroless plating bath.

The method, in accordance with the present invention, employs a permanent resist mask layer while, at the same time, minimizing any current leakage between adjacent circuit lines.

In accordance with the present invention the catalytic particles located beneath the permanent resist layer are immobilized and, therefore, the problem of current leakage is significantly reduced, if not entirely eliminated.

The process of the present invention results in insulating the remaining catalytic particles that are beneath the permanent resist material.

In particular, the process of the present invention comprises providing a non-conductive substrate that has at least one of its major surfaces roughened or rendered irregular. This provides for improved bonding sites for the subsequently provided seeder and plated metal thereon.

The substrate is contacted with a homogeneous colloidal dispersion of palladium/tin particles whereby the particles have a particle size of about 20 angstroms to about 50 angstroms. The palladium/tin particles are then activated by contacting with an alkali hydroxide solution. The alkali hydroxide solution is about 0.05 molar to about 1 molar.

A photosensitive composition is then laminated to the surfaces that contain the activated palladium/tin particles. The photosensitive composition must be one that is capable of providing a permanent protective coating on the substrate. The photosensitive composition is exposed to actinic light in a predetermined pattern and is then developed to provide a predetermined pattern on the at least one major surface of the substrate. The developing step provides a mask to mask out or define the non-circuit areas of the substrate. It is essential in accordance with the present invention that the permanent resist layer be applied by lamination to the substrate.

BEST AND VARIOUS MODES FOR CARRYING OUT INVENTION

The process of the present invention is applicable to treating or conditioning a wide variety of dielectric (non-conductive) substrates. Non-conductive substrates include thermoplastic, thermosetting resins, and glass and may be treated in accordance with the present invention.

Typical thermosetting polymeric materials include epoxy, phenolic-based materials, polyamides, and polyimides.

The dielectric materials may be molded articles of the polymers containing fillers and/or reinforcing agents such as glass-filled epoxy or phenolic-based materials.

Examples of some phenolic-type materials include copolymers of phenol, resorcinol, and cresol.

Examples of some suitable thermoplastic polymeric materials include polyolefins such as polypropylene, polysulfones, polycarbonates, nitrile rubbers, and ABS polymers.

The most typical polymers employed for the purposes of preparing printed circuit cards and boards are the epoxy resins. Typical epoxy resins include the bisphenol-A type resins obtained from bisphenol-A and epichlorohydrin; resinous materials obtained by the epoxidation of novolak resins produced from a phenolic material such as phenol and an aldehyde such as formaldehyde with epichlorohydrin; polyfunctional epoxy resins such as tetraglycidyldiaminodiphenyl methane and alicyclic epoxy resins such as bis(3)4-epoxy-6-methylcyclohexamethyl adipate. The most usual epoxy employed is of the bisphenol-A type.

Also, the resinous epoxy compositions can contain accelerating agents and curing agents, as well-known in the art. Examples of suitable curing agents include polyamines; primary, secondary, and tertiary amines; polyamides; polysulfones; urea-phenol-formaldehyde; and acids or anhydrides thereof. In addition, suitable curing agents include Lewis acid catalysts such as $BF_3$ and complexes thereof.

The dielectric substrate usually contains fillers and/or reinforcing fibers such as glass fibers. Such compositions containing fibers are usually prepared by impregnating the fibers with the epoxy composition. The amount of epoxy composition when combined with the fibers is usually about 30% to about 70% by weight and more usually about 55% to about 65% by weight of the total of the solids of the epoxy composition and the fiber.

After combining with the reinforcing fibers, the composition is cured to the B-stage and molded to the desired shape such as a sheet. When sheets are employed, the thickness is usually about 1.5 mils to about 8 mils and more usually about 2 mils to about 3 mils. The curing of the B-stage is generally achieved by using temperatures of about 80° C. to about 110° C. and for times of about 3 minutes to about 10 minutes.

The substrate can then be laminated onto another supporting substrate as is generally practiced.

For instance, the bonding of substrates can be carried out by pressing together a number of sheets in the substrate in a pre-sheeted laminating press at a predetermined pressure and temperature as, for example, about 200 psi to about 500 psi and more usually about 250 psi to about 300 psi and at about 180° C. The time for the pressing operation is variable, depending upon the particular materials employed and the pressures applied. About 1 hour is adequate for the above conditions.

Prior to the initiation in the process of the present invention for treating the dielectric substrate, the required through-holes in the substrate are made in the dielectric with the through-holes being suitably cleaned and preconditioned. For instance, the preconditioning can include creating active sites by physical means such as a sacrificial foil technique, sand, and/or vapor blasting and/or chemical means such as solvent swelling. A typical solvent is N-methylpyrrolidone. The substrate can also be pretreated with a sulfochromic acid composition.

At least one major surface of the substrate is roughened. For instance, a sheath or film of a metal such as copper, nickel, or aluminum is laminated onto the surface of the non-conductive substrate. The metal film is then stripped or etched completely from the substrate prior to application of any circuitry. This technique, referred to as the sacrificial metal technique, creates an irregular surface on the dielectric substrate which, in turn, provides for improved bonding sites for the subsequently applied catalyst and plated metal thereon. The preferred sacrificial metal employed pursuant to the present invention is copper. For instance, a copper sheet having a roughened surface is laminated onto the surface of the non-conductive substrate by pressing the roughened surface of the copper sheet against the substrate. An example of a suitable copper sheet is one having a thickness of about 25.4 $\mu$ micron. Subsequently, the copper foil is completely etched off, preferably by using an aqueous solution free of complexing agents and containing $CuCl_2$ and HCl. An aqueous solution of persulfate can also be used as the etching agent. The copper foil employed can be of the type prepared by the process disclosed in U.S. Pat. No. 4,358,479 to Canestaro, et al., disclosure of which is incorporated herein by reference.

According to preferred aspects of the present invention, the copper is etched at a temperature of about 120° F. for about 3 minutes to about 6 minutes in cupric chloride.

According to preferred aspects of the present invention, prior to the treatment with the tin/palladium composition, the substrate can be treated with an aqueous solution containing a multifunctional ionic polymer as disclosed in U.S. Pat. No. 4,478,883 to Bupp, et al. and U.S. Pat. No. 4,554,182 to Bupp, et al., disclosures of which are incorporated herein by reference.

The polymer is a multifunctional ionic material in that it contains at least two active or available ionic functional moieties of the same polarity. The polymers are at least water-miscible and are preferably water soluble or at least soluble in the water compositions employed. The preferred ionic moieties are cationic moieties such as quaternary phosphonium and quaternary ammonium groups. Polymers containing at least two ionic moieties are commercially available and need not be described herein in any great detail.

Examples of commercially available multifunctional cationic polymers are Reten 210, Reten 220, and Reten 300, available from Hercules, descriptions of which can be found in "Water-Soluble Polymers", Bulletin VC-482 A, Hercules Incorporated, Wilmington, Del. 19899, disclosure of which is incorporated herein by reference.

The Reten polymers are high molecular weight polymers (usually about 50,000 to about 1,000,000 or more) and have a main chemical backbone of polyacrylamide. The ionic polymer is usually employed as a dilute aqueous solution of about 0.01% to about 1% by weight, or more usually about 0.05% to about 0.5% of the copolymer. The aqueous solution also usually contains an inorganic acid such as $H_2SO_4$ or HCl to provide a pH of about 0 to about 7 and more usually a pH of about 0 to about 3. The acid is usually present in amounts of about 2% to about 10% by weight.

The treatment with the ionic polymer is generally about 1 minute to about 10 minutes.

After the substrate is contacted with the ionic polymer composition the substrate is rinsed to remove any excess polymer not absorbed by the substrate.

Next, the substrate is contacted with a homogeneous colloidal dispersion of palladium/tin particles having a particle size of about 10 angstroms to about 50 angstroms. The palladium/tin particles must have a particle size of about 10 angstroms to about 50 angstroms in order to achieve the results obtained by the present invention and, particularly, to assure that the necessary electrical resistance between adjacent conductive lines be maintained. The homogeneous colloidal dispersion of the palladium/tin particles usually contains about 1.59grams/liter to about 2.5 grams/liter of palladium, about 75 grams/liter to about 150 grams/liter weight of tin. The aqueous dispersions also can contain about 0.09 grams/liter to about 0.16 grams/liter of a non-ionic surfactant. Preferred nonionic surfactants are the fluorocarbons such as those available under the trade designation FC-95 which is a potassium perfluoroalkyl sulfonate. The colloidal dispersions may also contain sodium chloride in amounts of about 100 grams/liter to about 180 grams/liter weight. The homogeneous colloidal dispersions of the palladium/tin particles employed pursuant to the present invention are disclosed in and made by the process described in U.S. Pat. No. 4,593,016 to Amelio, et al., disclosure of which is incorporated herein by reference.

In order to prepare the substrate for the subsequent deposition of the metal thereon, it is necessary to subject the catalyzed substrate to an accelerating composition.

In accordance with the present invention it is necessary to employ an accelerating composition that contains an alkali hydroxide such as potassium hydroxide and preferably sodium hydroxide. The alkali hydroxide is present in the accelerating composition in an amount so as to provide a 0.05 molar to about a 1 molar, and preferably 0.4 molar to about a 0.6 molar composition. The acceleration is carried out at about room temperature to about 70° C and for about 30 seconds to about 90 seconds. It is important, in accordance with the present invention, that the acceleration step not be significantly greater than about 1.5 minutes since much greater times tend to remove or dislodge the palladium catalyst or damage the substrate material. The particular accelerating treatment is such that it results in removal of the ionic tin materials, but leaves remaining the palladium in discreet particle form.

This results in a surface coverage of Pd of about 1.5 $\mu g/cm^2$ to about 4.0 $\mu g/cm^2$ and tin of about $\leq 1\mu g/cm^2$. The Pd is sufficient for catalyzation of electroless plating, while the tin is sufficiently low to give a resistance between circuit lines of about $\geq 300$ Meg$\Omega$ at a spacing of 4 mil.

Next, a photosensitive composition is laminated to the catalyzed surface(s) of the substrate. The photosensitive composition employed must be one that is capable of providing a permanent protective coating.

The preferred photosensitive compositions employed pursuant to the present invention contain the reaction product from a mixture of at least one epoxidized non-linear novolak having at least about 6 terminal epoxy groups with at least about 0.9 moles of at least one monoethylenically unsaturated carboxylic acid per epoxide equivalent weight of the novolak. The epoxidized novolak polymers are commercially available and can be prepared by well-known methods by the reaction of a thermoplastic phenolic-aldehyde of a polynuclear dihydric phenol with a halo-epoxy alkane. The preferred polynuclear dihydric phenol is bisphenol-A. The preferred epoxidized novolak employed is represented by the average formula:

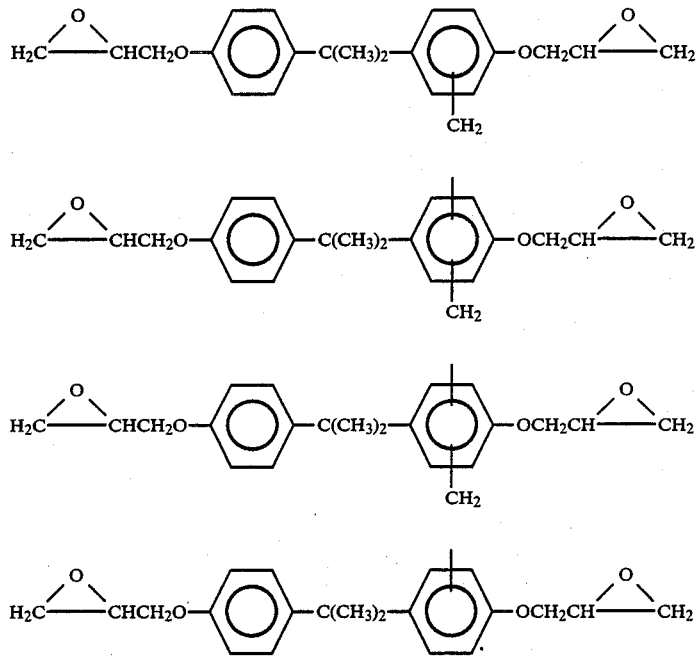

Such is commercially available under the trade designation Epi-Rez SU 8.

The epoxidized novolak is reacted with at least one monoethylenically unsaturated carboxylic acid in amounts of at least about 0.9 mole per epoxide equivalent of the epoxidized novolak. The monocarboxylic acid is generally used in amounts of 0.9 mole to about 2 moles and preferably at least about 1 mole per epoxide equivalent weight of the epoxidized novolak. The most preferred amounts of monocarboxylic acid are about 1 mole to about 1.2 moles per epoxide equivalent weight of the epoxidized novolak. Examples of suitable carboxylic acids include acrylic acid, methacrylic acid, and crotonic acid.

The photosensitive compositions also include a polyethylenically unsaturated compound that is capable of reacting under exposure to ultraviolet light and generally contains terminal ethylenic groups and is employed in an amount sufficient for rendering the compositions light-sensitive to the desired degree. The relative amount of the ethylenically unsaturated compound employed is generally about 0.5% to about 40%, and more usually about 1% to about 20%, and most usually at least about 3% by weight. The more usual polyethylenically unsaturated compounds employed include the polyethylene glycol diacrylates and trimethylol propane triacrylate. The compositions can also include a photoinitiator or sensitizer. Examples of such include the anthraquinone and substituted anthraquinones. Especially suitable photoinitiators are benzotriazole and tert-butylanthraquinone. The photoinitiators are employed in an amount sufficient to sensitize the composition to ultraviolet light, generally about 0.1% to about 10% and more generally from about 0.1% to about 5%.

In addition, the compositions might contain auxiliary agents such as additional hardeners for facilitating post-cure such as phenylamidazole when desired.

The photosensitive compositions preferred pursuant to the present invention are disclosed in U.S. Pat. No. 4,237,216 to Skarvinko, disclosure of which is incorporated herein by reference.

The compositions to be employed pursuant to the present invention are coated onto a carrier film. The carrier film must be capable of being stripped or releasable from the composition without damaging the integrity of the film formed and should be flexible enough so that it can be wound up for convenience. Suitable carrier films include polyethylene, polypropylene, polyesters such as polyethyleneterephthalate (e.g.—mylar), waxed paper, and paper containing a release coating such as a silicone.

The thickness of the photosensitive composition is usually about 0.7 mils to about 2 mils and preferably about 1.5 mils to about 1.8 mils. The coated carrier film is laminated to the catalyzed substrate with the photosensitive composition adjacent the substrate by heating between about 40° C. and about 60° C. and preferably about 48° C. and about 52° C. employing a vacuum of about 0.5 torr to about 0.2 torr. The lamination is usually completed in about 1 minute. It is essential in accordance with the present invention that the photosensitive material be laminated to the substrate so as to ensure interdiffusion between the photosensitive layer and the substrate in later processing. By ensuring this interdiffusion, the palladium particles beneath the photoresist are trapped, buried, and immobilized in the composite. This assures the necessary interline electrical resistance which must be greater than about $10^9$ ohms at about 50° C. at 80% relative humidity. This interdiffusion results in mobility of the photosensitive material in one direction and mobility of the substrate particles in the opposite direction. The carrier film is removed prior to or after exposure of the photosensitive material to the radiation.

Other less preferred, but suitable, photoresist materials include negative or photohardenable polymerizable compositions of the type suggested in U.S. Pat. Nos. 3,469,882; 3,526,504; 3,867,153; and 3,448,098; and published European Patent Application No. 0049504, disclosures of which are incorporated herein by reference. Polymers from methylmethacrylate and from glycidyl acrylate and/or from a polyacrylate such as trimetholol propane triacrylate and pentaerythritol triacrylate are commercially available from E. I. du Pont de Nemours and Company under the trade designation "Riston". Specific Riston polymers include Riston T-168 and Riston 3515.

The resist material is then selectively exposed to the desired pattern and imaged by a known technique such as ultraviolet light, electron beam, or X-ray beam technique, followed by removal of the unexposed portions in the case of negative resist materials.

With the preferred photosensitive materials employed pursuant to the present invention, exposure can be carried out employing a high-pressure mercury arc lamp at energy levels of about 250 millijoules to about 2 joules and preferably about 500 millijoules.

The development can be carried out employing a chlorocarbon such as methylchloroform or 1,1,1-trichloroethane. Such developers can also contain minor amounts, such as up to about 6% by weight of γ-butyro lactone.

After development, the photosensitive resist according to preferred aspects of the present invention can be subjected to a post-cure operation which includes exposing the entire remaining resist to a high-pressure mercury arc lamp employing about 0.5 joule to about 5 joules energy of ultraviolet.

Next, the composite can be baked at about 100° C. to about 200° C. for about 10 minutes to about 60 minutes and preferably at about 150° C. for about 20 minutes. This finalizes the cure and provides for the interdiffusion and sealing of the seeder under the photoresist.

The particular sequence of steps employed pursuant to the present invention makes it possible to accurately control the thickness of the subsequently to be plated copper, facilitate achieving finer lines, and ensures insulation between different conductive lines.

The substrate is now ready for plating of a conductive metal thereon from an electroless plating bath.

Examples of suitable metals are nickel, gold, and preferably copper. The preferred copper electroless plating baths and their method of application are disclosed in U.S. Pat. Nos. 3,844,799 and 4,152,467, disclosures of which are incorporated herein by reference.

The copper electroless plating bath is generally an aqueous composition that includes a source of cupric ion, a reducing agent, a complexing agent for the cupric ion, and a pH adjustor. The plating baths also generally include a cyanide ion source and a surface-active agent.

The cupric ion source generally used is cupric sulfate or a cupric salt of the complexing agent to be employed. When using cupric sulfate, it is preferred to use amounts of about 3 g/l to about 15 g/l and most preferably from about 6 g/l to about 12 g/l. The most common reducing agent employed is formaldehyde which, in the preferred aspects, is used in amounts from about 0.7 g/l to about 7 g/l and most usually from about 0.7 g/l to about 2.2 g/l. Examples of other suitable reducing agents include formaldehyde precursors or derivatives such as paraformaldehyde, trioxane, dimethylhydantoin, and glyoxal; borohydrides such as alkali metal borohydrides (sodium potassium borohydride) and substituted borohydrides such as sodium trimethoxy borohydride, and boranes such as amine borane (isopropyl amine borane and morpholine borane). Hypophosphite reducing agents can also be used for both electroless Ni and Cu plating baths.

Examples of some suitable complexing agents include Rochelle salts, ethylenediaminetetraacetic acid, the sodium (mono-, di-, tri-, and tetra-sodium) salts of ethylenediaminetetraacetic acid, nitrilotetraacetic acid and its alkali salts, gluconic acid, gluconates, triethanol amine, glucono (γ-lactone), modified ethylenediamine acetates such as N-hydroxy ethyl ethylenediaminetriacetate. In addition, a number of other cupric complexing agents are suggested in U.S. Pat. Nos. 2,996,408; 3,075,855; 3,075,856; and 2,938,805. The amount of complexing agent is dependent upon the amount of cupric ions present in the solution and is generally from about 20 g/l to about 50 g/l or in a 3-4 fold molar excess.

The plating bath can also contain a surfactant that assists in wetting the surface to be coated. A satisfactory surfactant is, for instance, an organic phosphate ester available under the trade designation "Gafac RE-610". Generally, the surfactant is present in amounts from about 0.02 g/l to about 0.3 g/l. In addition, the pH of the bath is also generally controlled, for instance, by the addition of a basic compound such as sodium hydroxide or potassium hydroxide in an amount to achieve the desired pH. The usual pH of the bath is between 11.6 and 11.8.

Also, the plating bath usually contains a cyanide ion salt and most usually contains about 10 mg/l to about 25 mg/l to provide a cyanide ion concentration in the bath within the range of 0.0002 molar to 0.0004 molar. Examples of some cyanides that can be employed are the alkali metal, alkaline earth metal, and ammonium cyanides. Also, the plating baths can include other minor additives.

The plating baths generally have a specific gravity within the range of 1.060 to 1.080. Also, the temperature of the bath is usually maintained between 70° C. and 80° C. and most usually between 70° C. and 75° C. For a discussion of the preferred plating temperatures coupled with preferred cyanide ion concentrations, see U.S. Pat. No. 3,844,799.

Also, the oxygen content of the bath can be maintained between about 2 ppm and about 4 ppm and more usually about 2.5 to about 3.5 ppm as discussed in U.S. Pat. No. 4,152,467. The oxygen content can be controlled by injecting oxygen and an inert gas into the bath. The overall flow rate of the gases in the bath is usually from 1 SCFM to about 20 SCFM per 1000 gallons of bath and more usually from about 3 SCFM to about 8 SCFM per 1000 gallons of bath.

The following non-limiting example is presented herein to further illustrate the present invention:

EXAMPLE

Epoxy-glass laminate multilayer panels having through-holes are cleaned for about 5 minutes at a temperature of about 45°-60° C. in an alkaline cleaner available under the trade designation K-2 and being an aqueous solution of sodium phosphate and sodium silicate and having a pH of about 13. The cleaner is rinsed off twice with deionized water having a temperature of about 45°-60° C.

The substrate surface of each panel, including the holes, is treated by immersion in a 0.05 weight % solution of Reten 210 from Hercules in 2% by weight sulfuric acid for about 2 minutes. Reten 210 is in powder form and is a copolymer of acrylamide and beta-methacryl-oxyethyltrimethylammonium-methyl sulfate of which a 1% solution has a Brookfield viscosity of 600-1000 cps. The substrates are rinsed twice with deionized water.

The panels are then immersed for about three minutes in a colloidal suspension seeder bath obtained from about 80 grams of $SnC_{12} \cdot 2H_2O$ per liter; about 1.2 grams of $PdCl_2$ per liter; about 85 ml of 37% HCl per liter; about 0.09 grams of FC-95 per liter and about 150 grams of NaCl per liter. FC-95 is a potassium perfluoroalkyl sulfonate non-ionic surfactant.

The panels are then rinsed twice in deionized water and then processed through an acceleration solution of about 0.5 M sodium hydroxide for about 2 minutes. The panels are then rinsed once with deionized water at about room temperature for about 1 minute, followed by a rinse in deionized water at about 45°-60° C. for about 1 minute, and then dried in a forced air oven at about 70° C. for about 20 minutes. This processing yields a palladium surface coverage of about 3.5 $\mu g/cm^2$ and a tin coverage of about 1.1 $\mu g/cm^2$.

The panels are then coated with a photosensitive composition by lamination at about 48° C. to about 52° C. under a vacuum of about 0.5 torr to about 0.2 torr. The photosensitive composition is obtained by mixing about 88 grams of Epi-Rez Su8, an octofunctional epoxidized novolak available from Celanese REsins, with about 100 grams of methyethyl ketone followed by filtering through 10 micron filter paper, then adding with stirring, about 12 grams of CY179, a cycloaliphatic epoxide available from Ciba-Geigy, followed by adding in yellow light about 4 grams of UVE 1017, a triarylsulphonium salt (50% solution) available from General Electric.

The photosensitive composition is coated prior to the lamination onto a strippable carrier film using a doctor blade to provide an average thickness is about 0.0018 inch with a variance of ±0.0003 inch.

The coating is exposed imagewise using an Oriel 560 UV generator and a Stouffer resolution guide, after which the coating is developed with 1,1,1-trichloromethane to reveal a crosslinked pattern of resist corresponding to the UV radiation struck areas. Cure of the resist pattern is advanced by baking in an oven at about 100° C. for about 10 minutes.

The panels are then contacted with an electroless plating bath containing about 10 grams/liter of $CuSO_4 \cdot 5H_2O$; about 353 grams/liter of ethylene diamine tetraacetic acid dihydrate; about 0.25 grams/liter of GAFAC RE-610, about 14 milligrams/liter sodium cyanide, and about 2 grams/liter 37% aqueous HCHO. The specific gravity of the plating bath is about 1.07, the pH is 11.7 by the addition of NaOH and the temperature of the bath is about 73°±5° C. The $O_2$ content of the bath is maintained at about 2.5 to 3.5 ppm. The gas flow-rate is rate 12 SCFM. The substrate containing the copper pattern has an insulation resistance of $\geq 300 m\Omega$ at 100 volts for copper circuit lines spaced 4 mils apart.

Having thus described our invention, what we claim as new and desire to secure by Letters Patent is:

1. Method for conditioning a non-conductive substrate for the subsequent selective deposition thereon of a metal from an electroless plating bath which comprises:

providing a non-conductive substrate having at least one of its major surfaces roughened;

contacting said at least one of its major surfaces with a homogeneous colloidal dispersion of palladium/tim particles having a particle size of about 10 angstroms to about 50 angstroms;

activating said palladium/tin particles by contacting with an alkali hydroxide solution of about 0.05 molar to about 1 molar;

laminating to said at least one major surface a photosensitive composition capable of providing a permanent protecting coating;

exposing said photosensitive composition to actinic light in a predetermined pattern; and then developing said photosensitive composition to provide a predetermined pattern on said at least one major surface, whereby palladium particles, remaining beneath the photosensitive composition remaining as said permanent protective coating after the developing, are insulated and immobilized to thereby reduce current leakage between adjacent circuit lines from the subsequent selective deposition on the substrate of a metal from an electroless plating bath.

2. The method of claim 1 wherein said non-conductive substrate includes a thermosetting polymeric material.

3. The method of claim 1 wherein said non-conductive substrate includes an epoxy resin.

4. The method of claim 1 wherein said non-conductive substrate includes glass-reinforced epoxy material.

5. The method of claim 1 wherein at least one of the major surfaces of the non-conductive substrate is roughened by sacrificial metal technique.

6. The method of claim 5 wherein said metal is copper.

7. The method of claim 1 wherein at least one of the major surfaces of the non-conductive substrate is roughened by providing a copper sheet having a roughened surface; laminating said copper sheet to said at least one of the major surfaces by pressing the roughened surface of said copper sheet against the surface of said substrate; and etching away all of the copper.

8. The method of claim 1 which further includes conditioning the at least one of the major surfaces prior to treatment with the palladium/tin particles by contacting with an acidic solution containing a multifunctional cationic group containing at least two available ionic moieties.

9. The method of claim 1 wherein said colloidal dispersion contains about 1.5 to about 2.5 grams/liter of palladium and about 75 to about 150 grams/liter of tin.

10. The method of claim 1 wherein said activating is carried out at room temperature to about 70° C. for about 30 seconds to about 60 seconds.

11. The method of claim 1 wherein said hydroxide solution is a 0.1 molar to 0.3 molar sodium hydroxide solution.

12. The method of claim 1 wherein said photosensitive composition includes reaction product of a mixture of at least one epoxidized non-linear novolak having at least 6 terminal epoxy groups with at least about 0.9 moles of at least one monoethylenically unsaturated carboxylic acid per epoxide equivalent weight of said novolak.

13. The method of claim 12 wherein said novolak is represented by the average formula:

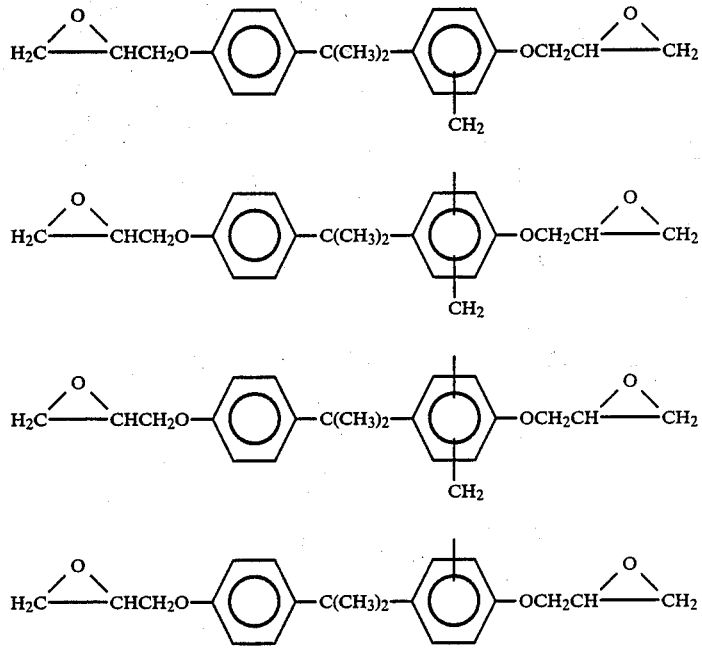

14. The method of claim 12 wherein said photosensitive composition also contains about 1% to about 20% by weight of a polyethylenically unsaturated compound.

15. The method of claim 1 wherein the thickness of the photosensitive composition is about 0.7 mil to about 2 mils.

16. The method of claim 1 wherein the thickness of the photosensitive composition is about 1.5 mils to about 1.8 mils.

17. The method of claim 1 wherein said photosensitive composition is post-cured.

18. The method of claim 1 which further includes after the developing of the photosensitive composition depositing on said substrate in said predetermined pattern a metal from an electroless plating bath.

19. The method of claim 18 wherein said metal is copper.

20. The method of claim 18 whereby said laminating ensures interdiffusion between the photosensitive composition and the substrate so that the electrical resistance between adjacent circuit lines is greater than about $10^9$ ohms at about 50° C. at 80% relative humidity.

* * * * *